(12) United States Patent
Bell et al.

(10) Patent No.: US 6,660,645 B1
(45) Date of Patent: Dec. 9, 2003

(54) PROCESS FOR ETCHING AN ORGANIC DIELECTRIC USING A SILYATED PHOTORESIST MASK

(75) Inventors: Scott A. Bell, San Jose, CA (US); Todd P. Lukanc, San Jose, CA (US); Christopher F. Lyons, Fremont, CA (US); Marina V. Plat, San Jose, CA (US); Ramkumar Subramanian, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/051,725

(22) Filed: Jan. 17, 2002

(51) Int. Cl.7 .............................................. H07L 21/302
(52) U.S. Cl. ...................... 438/706; 438/689; 438/710; 438/712; 438/719; 438/720; 438/723; 438/725; 438/733; 438/740; 438/789; 438/769; 438/780; 438/637
(58) Field of Search ................................. 438/689, 706, 438/710, 712, 719, 720, 723, 725, 733, 740, 789, 769, 780, 637

(56) References Cited

U.S. PATENT DOCUMENTS

| | | | |
|---|---|---|---|
| 5,115,082 A | 5/1992 | Mercer et al. | |
| 5,562,801 A | 10/1996 | Nulty | |
| 5,658,994 A | 8/1997 | Burgoyne, Jr. et al. | |
| 6,063,543 A | 5/2000 | Hien et al. | |
| 6,521,542 B1 * | 2/2003 | Armacost et al. | 438/712 |

* cited by examiner

Primary Examiner—Kamand Cuneo
Assistant Examiner—Lisa Kilday
(74) Attorney, Agent, or Firm—Foley & Lardner

(57) ABSTRACT

A process for forming a semiconductor device may comprise forming an organic dielectric layer on a substrate, forming a protective layer on the organic dielectric layer, forming a photoresist mask on the protective layer, and silyating the photoresist mask. The protective layer is etched using the silyated photoresist mask as an etch mask, and then the organic dielectric layer is etched using the silyated photoresist mask as an etch mask. Metal may be deposited in a void etched in the organic dielectric layer to form a wiring, contact or via.

15 Claims, 4 Drawing Sheets

Etching organic low-k dielectric using silyated photoresist as an etch mask and oxidation of silyated photoresist Photoresist exposure Photoresist development Silyation of photoresist Etching hardmask using silyated photoresist as an etch mask Etching organic low-k dielectric using silyated photoresist as an etch mask and oxidation of silyated photoresist Stripping silicon oxide etch mask Filling void with metal to form contact

PROCESS FOR ETCHING AN ORGANIC DIELECTRIC USING A SILYATED PHOTORESIST MASK

FIELD OF THE INVENTION

Embodiments of the present invention pertain to semiconductor fabrication, and in particular to processes for etching a feature in a low dielectric constant (low-k) organic dielectric.

BACKGROUND TECHNOLOGY

Integrated circuits(ICs) are manufactured by forming discrete semiconductor devices on the surface of a silicon wafer, and then forming a metal interconnection network in contact with the devices to create circuits. The metal interconnection network is composed of horizontal layers of individual metal wirings that are interconnected by vertical contacts or vias. Contacts and vias are formed by depositing an insulating layer over a structure to be contacted, such as a discrete device or a metal wiring, patterning and etching openings into the insulating layer, and then depositing metal into the openings in contact with the underlying device or wiring. Wiring may be formed by applying a metal layer over an insulating layer, patterning the metal layer into individual metal wires, and applying an interlevel dielectric material to fill the spaces between the wires. Alternatively, metal wiring may be formed using a damascene technique by depositing an insulating layer, forming trenches in the insulating layer, depositing metal over the insulating layer, and polishing back the metal to the surface of the insulating layer, leaving trenches filled with metal. A typical interconnection network employs multiple levels of wiring and vias.

The performance of integrated circuits is determined in large part by the conductance and capacitance of the metal wiring network. Conventionally, aluminum wiring and silicon oxide interlevel dielectric layers have been used. However, as device densities increase and geometries decrease, the RC time constraints of the interconnection network have increasingly restricted integrated circuit performance. To address this problem, various low dielectric constant organic insulators such as parylene and arylene ether polymers have been employed successfully as replacements for silicon oxide. Examples of such polymers are disclosed in U.S. Pat. No. 5,115,082 and U.S. Pat. No. 5,658,994. The term "low-k," when applied to organic dielectrics generally refers to a dielectric constant of less than about 3.5 and preferably less than about 2. For example, the conventional organic low-k dielectrics known as PAE-2 and PAE-4, have dielectric constants of 2.41 and 2.42 respectively when measured at 1 MHz. Organic low-k dielectrics are typically spin coated onto silicon wafers and cured.

Many conventional dielectric patterning processes utilize a photoresist mask as an etch mask in a plasma etching or reactive ion etching (RIE) process. However, where organic low-k dielectric materials are used, the use of photoresist etch mask is problematic because the $O_2/Ar$ or $O_2/He$ etchant chemistry that is conventionally employed to etch the organic dielectric has a low selectivity with respect to photoresist. Conventional techniques address this problem by employing a hardmask to etch the organic dielectric. Typically, a layer of silicon oxide, deposited by PECVD (plasma enhanced chemical vapor deposition) is applied over the cured organic dielectric. A silicon oxide hardmask is formed by patterning the silicon oxide layer. The silicon oxide hardmask is then used to pattern the underlying organic dielectric. However this process has several complications. Stripping of the photoresist mask from the hardmask entails selectivity problems with respect to the organic dielectric. Further, the chemistry used to etch the organic dielectric creates problems with respect to the profile of the opening in the hardmask and the sidewall profile of the etched organic dielectric. The etching conditions that produce straight sidewalls in the organic dielectric etch the sidewalls of the openings in the hardmask such that they become angled and broader at their tops. This condition, referred to as faceting, degrades pattern integrity and can cause a high incidence of via shorts. It would therefore be advantageous to remove the faceted hardmask after etching of the organic layer. However, the chemistry for removing the hardmask is damaging to the conductive layer that is exposed by etching the organic layer. Thus it is desirable to adjust the etching conditions to eliminate faceting. However, the etching conditions that prevent faceting produce a bowed profile in the sidewalls of the organic dielectric. Consequently, conventional hardmask techniques represent a compromise between these two undesirable effects that is unable to completely avoid either of bowed sidewalls and faceted hardmask.

Conventional integrated circuit fabrication techniques may employ a process known as silyation. Generally, silyation involves the introduction of silicon into a photoresist material. Conventional techniques use silyation in combination with projection lithography in a process called a dual multilayer resist process. In this process, a thick layer of photoresist is applied over a non-uniform substrate to provide a planar photoresist surface. A pattern is then projected onto the photoresist, causing exposure of an upper portion of the photoresist layer. This is referred to as top surface imaging (TSI). Depending on the photoresist chemistry, the exposure increases or decreases the permeability of the photoresist to silicon in the exposed area. A silyation process is then performed to selectively introduce silicon into the permeable areas of the photoresist. The photoresist is then exposed to an anisotropic oxygen plasma etch, which converts the silyated photoresist to etch resistant silicon dioxide while simultaneously etching the photoresist that does not lie beneath the silyated photoresist areas. This technique allows the formation of a planar surface through application of a thick layer of photoresist to avoid distortions that would be caused by projection onto a nonplanar layer, without introducing the optical distortions that would result from exposure of the entire thickness of the photoresist.

Various chemistries for silyation of photoresist are known in the art. Silyation agents may be supplied as a gas in a dry silyation method, such as is described in U.S. Pat. No. 5,562,801, or may be supplied as a liquid in a wet chemistry method, such as is described in U.S. Pat. No. 6,063,543.

While silyation has been used to minimize defects in patterns formed in a photoresist layer by projection lithography, conventional technology has not employed silyation for the purpose of resolving the etch selectivity problem between photoresist and organic low-k dielectric.

Thus there remains a need for a process that allows a photoresist mask to be employed as an etch mask for an organic low-k dielectric while avoiding etch selectivity problems.

SUMMARY OF THE INVENTION

In accordance with embodiments of the invention, a photoresist mask may be employed as an etch mask for an organic low-k dielectric. The photoresist mask is silyated prior to etching, thereby increasing its resistance to the etching chemistry used to etch the organic low-k dielectric. The $O_2$ plasma etch of the organic low-k dielectric further converts the silyated photoresist to silicon oxide. Thus, stripping of the silyated photoresist mask may be performed using an etch chemistry that is selective to silicon oxide and does not etch the sidewalls of the organic low-k dielectric.

In accordance with embodiments of the invention, a process for forming a semiconductor device may comprise forming an organic dielectric layer on a substrate, forming a protective layer on the organic dielectric layer, forming a photoresist mask on the protective layer, and silyating the photoresist mask. The protective layer is etched using the silyated photoresist mask as an etch mask, and then the organic dielectric layer is etched using the silyated photoresist mask as an etch mask. Metal may be deposited in a void etched in the organic dielectric layer to form a wiring, contact or via.

Other features and advantages of the present invention will become apparent to those skilled in the art upon review of the following drawings, detailed description, and appended claims.

BRIEF DESCRIPTION OF THE DRAWINGS

An exemplary embodiment will hereafter be described with reference to the accompanying drawings, wherein like numerals denote like elements, and.

DETAILED DESCRIPTION OF PREFERRED EMBODIMENTS

Figure 1:
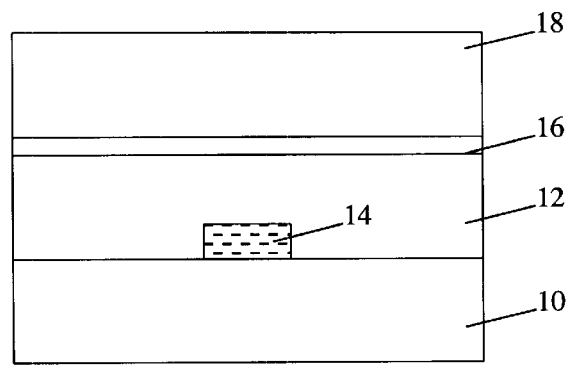
FIG. 1 shows a substrate structure having a wiring, an organic dielectric layer, a protective layer and a photoresist layer formed thereon in accordance with a preferred embodiment of the invention.

FIGS. 1 through 8 show structures formed at successive stages of a process for forming a via in accordance with a preferred embodiment of the invention. FIG. 1 shows a structure in which a via is to be formed. The structure includes a substrate 10, organic low-k dielectric layer 12, a metal wiring 14, a SiN protective layer 16, and a photoresist layer 18. In accordance with embodiments of the invention, the term substrate is used herein to refer to a structure upon which or in which there is formed a conductive element. Thus while FIG. 1 shows a wiring 14 as a conductive element formed on the substrate, the substrate could alternatively contain a conductive portion of an active device, such as a diffusion or gate electrode of a MOSFET, or a contact or via.

Figure 2:
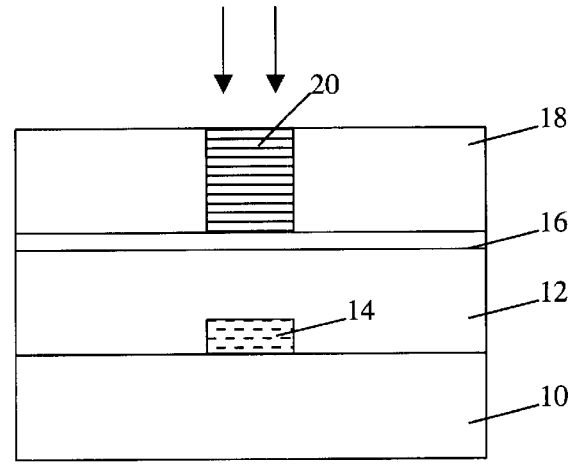
FIG. 2 shows a structure formed by selective exposure to radiation of the structure of FIG. 1 in accordance with a preferred embodiment of the invention.

FIG. 2 shows the structure of FIG. 1 after exposure of the photoresist to a radiation pattern projected using a projection lithography system, resulting in the formation of an exposed area 20 in the photoresist. The example of FIG. 2 employs a dark field masking process using a negative photoresist, whereby areas of photoresist to be removed during development are exposed to radiation and areas to be retained after development are shielded from radiation. However, a bright field masking process using a positive photoresist may be alternatively employed.

Figure 3:
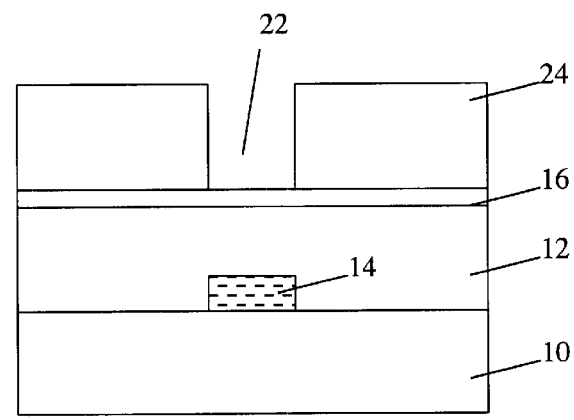
FIG. 3 shows a structure formed by development of photoresist of the structure of FIG. 2 in accordance with a preferred embodiment of the invention.

FIG. 3 shows the structure of FIG. 2 after a development process has been performed. In this example, development removes the exposed photoresist, leaving a void 22 in the photoresist that exposes the underlying protective layer 16.

Figure 4:
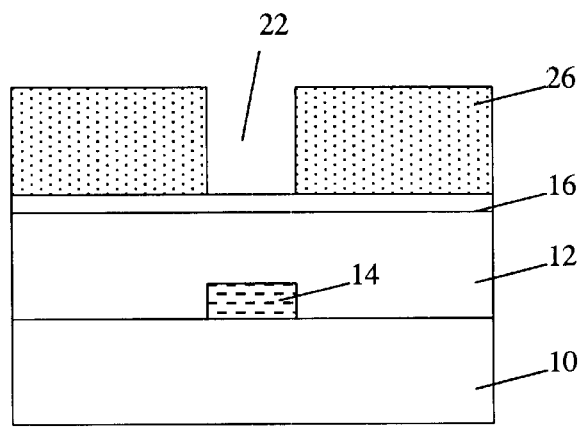
FIG. 4 shows a structure formed by silyation of the structure of FIG. 3 in accordance with a preferred embodiment of the invention.

FIG. 4 shows the structure of FIG. 3 after silyation of the photoresist is performed to convert the remaining photoresist into silyated photoresist 26. Silyation may be performed using either a wet or a dry process. Silyation is performed for an amount of time sufficient to incorporate enough silicon into the photoresist matrix to increase the etch selectivity of the photoresist relative to the organic dielectric to a desired amount. A selectivity of 10 to 100 is preferred. Typical silicon content is 5% to 20%. It is preferred to perform silyation such that the entire thickness of photoresist contains a sufficient amount of silicon to enable conversion of the entire silyated photoresist structure to structurally stable silicon oxide during organic dielectric etching as described below. Alternatively, the silyation may be performed to impregnate at least an outer layer of the photoresist with silicon so that the outer layer is converted to oxide during subsequent etching of the low-k dielectric as described below.

Figure 5:
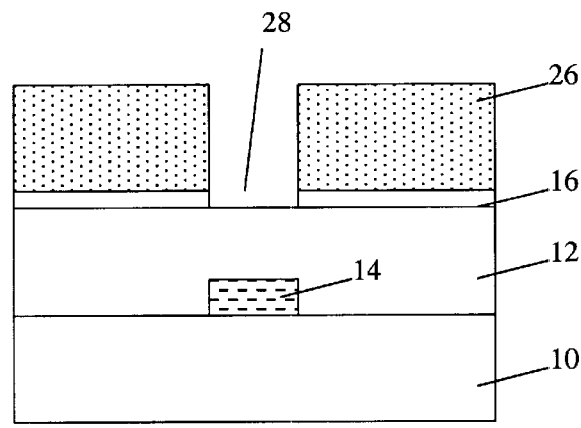
FIG. 5 shows a structure formed by anisotropic etching of the structure of FIG. 4 in accordance with a preferred embodiment of the invention.

FIG. 5 shows the structure of FIG. 4 after etching of the SiN protective layer 16 using the silyated photoresist as an etch mask, for example using fluorine based chemistry. The etching creates a void 28 in the protective layer 16 that exposes the underlying organic dielectric layer 12.

Figure 6:
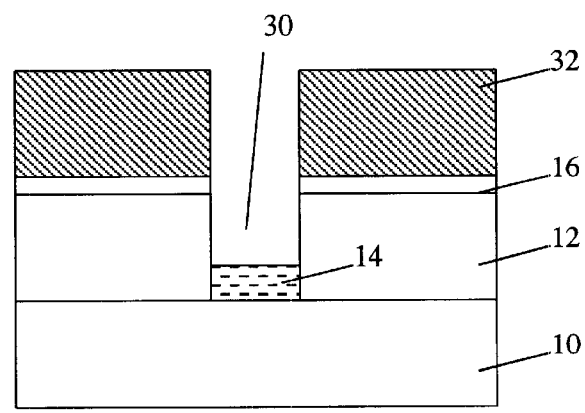
FIG. 6 shows a structure formed by anisotropic etching of the structure of FIG. 5 in accordance with a preferred embodiment of the invention.

FIG. 6 shows the structure of FIG. 5 after anisotropic etching of the organic low-k dielectric layer 12 using an oxygen plasma. The etch creates a void in the organic low-k dielectric layer 12 that exposes the underlying wiring 14. The etching also simultaneously converts the silyated photoresist to silicon oxide 32. Because the photoresist is silyated, the initial exposure of the silyated photoresist to the oxygen plasma causes relatively little etching of the photoresist compared to the etching caused to the organic dielectric. This preserves the shape of the photoresist etch mask and preserves coverage of the protective layer 16, thus preventing the faceting problem of conventional methods.

Figure 7:
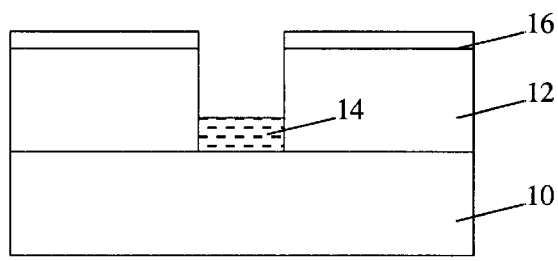
FIG. 7 shows a structure formed by stripping a mask from the structure of FIG. 6 in accordance with a preferred embodiment of the invention.

FIG. 7 shows the structure of FIG. 6 after the silicon oxide layer 32 has been stripped from the protective layer 16. The stripping is performed using a chemistry that is highly selective of the silicon oxide with respect to the protective layer 16 and the organic dielectric 12, such as by dry etching in a fluorinated environment, or by immersion in a wet etching compound such as hydrofluoric acid.

Figure 8:
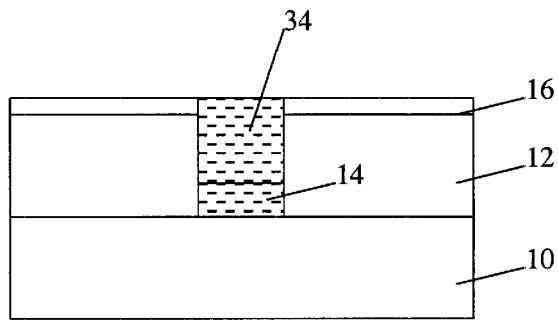
FIG. 8 shows a structure formed by depositing metal in a void of FIG. 7 in accordance with a preferred embodiment of the invention.

FIG. 8 shows the structure of FIG. 7 after metal has been deposited in contact with the exposed wiring 14 to form a via 34. The via may be formed by depositing metal over the protective layer 16 and polishing away excess metal using chemical mechanical polishing (CMP). Any conventional metal such as copper, aluminum or tungsten may be used.

Those having ordinary skill in the art will recognize a variety of alternatives to the preferred process illustrated in FIGS. 1 through 8. For example, while the preferred embodiment involves the formation of a via for connecting a wiring to an overlying conductor, alternative embodiments of the invention may form contacts in connection with device structures such as diffusions and electrodes, or may form trenches for wiring. Moreover, processes in accordance with embodiments of the invention may be adapted to alternative layer structures. For example, in the preferred embodiment, the substrate 10 and wiring 14 may be covered by an encapsulating layer, in which case the process may include a further etching step subsequent to etching of the organic dielectric for the purpose of removing the encapsulating material from the upper surface of the wiring. Where the encapsulating material is a silicon oxide, this etching may be performed simultaneously with stripping of oxide from the protective layer.

Figure 9:
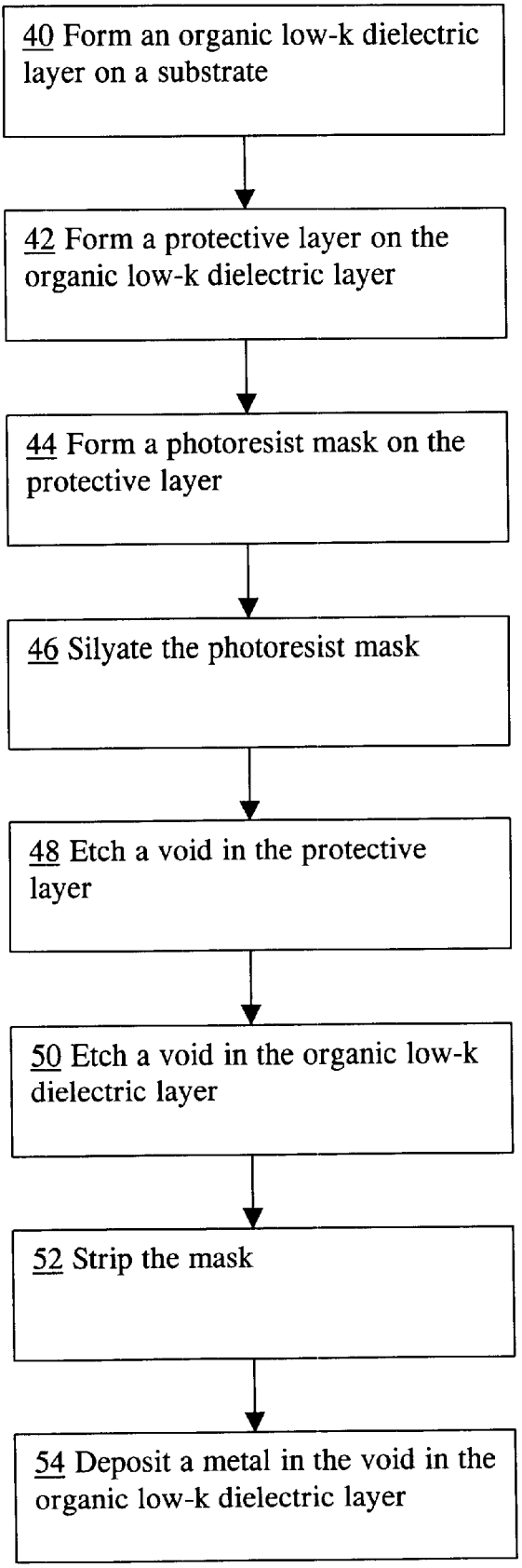
FIG. 9 shows a fabrication process in accordance with embodiments of the invention.

Embodiments of the invention are therefore applicable to a variety of structures in which it is desirable to etch an organic dielectric using an etch mask formed from photoresist. A basic process in accordance with embodiments of the invention is illustrated in FIG. 9. Initially, an organic low-k dielectric layer is formed 40 on a substrate. The substrate may be any material that has formed thereon or therein a conductive portion such as a diffusion, electrode, wiring or via. The conductive portion may form part of the upper surface of the substrate, such that the organic dielectric is formed in direct contact with the conductive portion, or there may be intervening materials between the organic dielectric and the conductive portion of the substrate.

After the organic dielectric is deposited 40, a protective layer is formed 42 over the organic dielectric. The protective layer may be formed of SiN or SION or another conventional protective material. A photoresist mask is then formed 44 on the protective layer. The photoresist mask may be formed using either a positive or negative photoresist chemistry. The photoresist mask is then silyated 46. Silyation may be performed using either a wet or dry silyation process. Silyation is preferably performed until silicon has permeated the entire thickness of the photoresist layer.

After silyation 46, a void is etched 48 in the protective layer using the silyated photoresist mask as an etch mask. A void is then etched 50 in the organic low-k dielectric using the silyated photoresist mask as an etch mask. The etch is preferably performed using an oxide plasma that simultaneously oxidizes the silicon in the photoresist. The etch is preferably performed for sufficient time to oxidize all of the silicon in the silyated photoresist.

After the organic dielectric is etched 50, the mask is stripped 52 from the protective layer. Metal is then deposited 54 in the void in the organic dielectric to form a structure such as a contact, a via or a wiring. The metal may extend into the void in the protective layer. Metal may be deposited in any conventional manner, for example, by a sputtering process followed by chemical mechanical polishing.

It will be apparent to those having ordinary skill in the art that the tasks described in the above process are not necessarily exclusive of other tasks, but rather that further tasks may be incorporated into the above process in accordance with the particular structures being formed. Thus, for example, where a conductive portion of the substrate is encapsulated with an insulating material, the encapsulating material will be etched after etching of the organic dielectric and prior to depositing metal in the void. Thus, while the embodiments illustrated in the figures and described above are presently preferred, it should be understood that these embodiments are offered by way of example only. The invention is not limited to a particular embodiment, but extends to various modifications, combinations, and permutations that fall within the scope and spirit of the appended claims.

What is claimed is:

1. A process for forming a semiconductor device comprising:

forming an organic dielectric layer on a substrate;

forming a protective layer on the organic dielectric layer;

forming a photoresist mask on the protective layer;

silyating the photoresist mask;

etching the protective layer using the silyated photoresist mask as an etch mask; and etching the organic dielectric layer to form a void in the organic dielectric layer using the silyated photoresist mask as an etch mask.

2. The process claimed in claim 1, further comprising:

removing the silyated photoresist mask from the protective layer; and depositing a metal in the void in the organic dielectric layer.

3. The process recited in claim 2, wherein the substrate comprises a wiring, and said metal is deposited in contact with said wiring.

4. The process recited in claim 2, wherein the substrate comprises an electrode, and wherein said metal is deposited in contact with said electrode.

5. The process recited in claim 2, wherein the substrate comprises a diffusion, and wherein said metal is deposited in contact with said diffusion.

6. The process recited in claim 2, wherein the substrate comprises a via, and wherein said metal is deposited in contact with said via.

7. The process recited in claim 2, wherein depositing said metal comprises sputtering the metal and removing excess metal by chemical mechanical polishing.

8. The process recited in claim 1, wherein said organic dielectric is a low-k dielectric.

9. The process recited in claim 8, wherein said organic dielectric comprises at least one of parylene ether polymer and arylene ether polymer.

10. The process recited in claim 1, wherein said protective layer is one of SiN and SiON.

11. The process recited in claim 1, wherein said photoresist mask comprises a positive photoresist.

12. The process recited in claim 1, wherein said photoresist mask comprises a negative photoresist.

13. The process recited in claim 1, wherein said organic dielectric layer is etched using an oxygen plasma.

14. The process recited in claim 13, where said oxygen plasma converts the entirety of said silyated photoresist mask to silicon oxide.

15. The process recited in claim 13, where said oxygen plasma converts at least an outer layer of said silyated photoresist mask to silicon oxide.

* * * * *